(12) United States Patent
Shum

(10) Patent No.: US 10,032,783 B2
(45) Date of Patent: Jul. 24, 2018

(54) INTEGRATED CIRCUITS HAVING AN ANTI-FUSE DEVICE AND METHODS OF FORMING THE SAME

(71) Applicant: GLOBALFOUNDRIES Singapore Pte. Ltd., Singapore (SG)

(72) Inventor: Danny Pak-Chum Shum, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 14/927,981

(22) Filed: Oct. 30, 2015

(65) Prior Publication Data

US 2017/0125427 A1    May 4, 2017

(51) Int. Cl.
| | |
|---|---|
| *H01L 27/112* | (2006.01) |
| *H01L 23/525* | (2006.01) |
| *H01L 23/528* | (2006.01) |
| *H01L 29/423* | (2006.01) |
| *H01L 29/08* | (2006.01) |
| *H01L 21/8234* | (2006.01) |

(52) U.S. Cl.
CPC ............. *H01L 27/11206* (2013.01); *H01L 21/823425* (2013.01); *H01L 21/823437* (2013.01); *H01L 21/823462* (2013.01); *H01L 23/528* (2013.01); *H01L 23/5252* (2013.01); *H01L 29/0847* (2013.01); *H01L 29/42368* (2013.01); *H01L 29/42376* (2013.01)

(58) Field of Classification Search
CPC ......... H01L 27/11206; H01L 27/11246; H01L 29/42368
See application file for complete search history.

(56) References Cited

U.S. PATENT DOCUMENTS

| 8,227,873 | B2* | 7/2012 | Smith | H01L 27/112 257/390 |
|---|---|---|---|---|
| 2003/0218487 | A1* | 11/2003 | Madurawe | G11C 17/16 327/199 |
| 2004/0023440 | A1* | 2/2004 | Ito | H01L 23/5252 438/131 |
| 2006/0244099 | A1* | 11/2006 | Kurjanowicz | G11C 17/16 257/530 |
| 2006/0292754 | A1* | 12/2006 | Min | H01L 23/5252 438/131 |

(Continued)

*Primary Examiner* — Bryan Junge
(74) *Attorney, Agent, or Firm* — Lorenz & Kopf, LLP

(57) ABSTRACT

Integrated circuits and methods of forming the same are provided. An exemplary integrated circuit includes a semiconductor substrate and an anti-fuse device having a select transistor, a bitline contact, and a split channel transistor. The select transistor includes a select gate structure, a bitline source/drain region, and a shared source/drain region. The bitline contact is disposed over and in electrical communication with the bitline source/drain region. The split channel transistor is in electrical communication with the select transistor through the shared source/drain region. The split channel transistor includes an anti-fuse gate structure having an anti-fuse gate and an anti-fuse dielectric layer and a stepped gate structure disposed between the anti-fuse gate structure and the shared source/drain region and having a stepped gate and a stepped dielectric layer. The stepped dielectric layer has a greater thickness than the anti-fuse dielectric layer.

11 Claims, 2 Drawing Sheets

(56) References Cited

U.S. PATENT DOCUMENTS

| | | | | |
|---|---|---|---|---|
| 2006/0292755 | A1* | 12/2006 | Parris | H01L 23/5252 438/132 |
| 2007/0114596 | A1* | 5/2007 | Candelier | H01L 27/0207 257/324 |
| 2008/0042235 | A1* | 2/2008 | Kodama | G11C 17/16 257/530 |
| 2009/0237975 | A1* | 9/2009 | Schmitt | G11C 17/16 365/96 |
| 2009/0250726 | A1* | 10/2009 | Kurjanowicz | H01L 23/5252 257/209 |
| 2010/0032732 | A1* | 2/2010 | Booth, Jr. | H01L 23/5252 257/288 |
| 2011/0272758 | A1* | 11/2011 | Banerjee | H01L 23/5252 257/328 |
| 2013/0059238 | A1* | 3/2013 | Kurjanowicz | G11C 17/16 430/5 |
| 2014/0124864 | A1* | 5/2014 | Hong | H01L 21/02532 257/355 |
| 2014/0209989 | A1* | 7/2014 | Kurjanowicz | G11C 17/16 257/314 |
| 2015/0287730 | A1* | 10/2015 | Wu | G11C 5/06 365/96 |

* cited by examiner

INTEGRATED CIRCUITS HAVING AN ANTI-FUSE DEVICE AND METHODS OF FORMING THE SAME

TECHNICAL FIELD

The technical field generally relates to integrated circuits that have an anti-fuse device and methods of forming the same, and more particularly relates to integrated circuits having robust anti-fuse device configurations and methods of forming the same within existing fabrication schemes.

BACKGROUND

Anti-fuse technology is popular for use in one-time programmable (OTP) memory devices and can be employed to meet various non-volatile memory requirements of many applications while offering low power operation, low cost, and excellent reliability. Known anti-fuse technologies include 2 T anti-fuse bitcells and split channel 1 T (or 1.5 T) anti-fuse bitcells.

The 2 T anti-fuse bitcells include two core N-channel metal oxide semiconductor (NMOS) transistors. For the 2 T anti-fuse bitcells, a program or anti-fuse (AF) transistor is generally coupled in series with a select transistor, with a bitline contact connected to a source region of the select transistor. When a normal supply voltage such as an I/O or core voltage is applied to the gates of the 2 T anti-fuse bitcell, no current is sensed along the bitline. The equivalent circuit for the program transistor is a capacitor. Since there is no current that flows along the bitline, the bitcell is "0" by default. When a large programming voltage is applied along the gate of the AF transistor, gate dielectric breakdown occurs and a resistive path is created. The equivalent circuit for the AF transistor becomes a resistor. A normal supply voltage applied to the gates of the 2 T anti-fuse transistor after programming result in current flow along the bitline and a "1" is sensed. The AF transistors can be programmed at any time. Once programmed, the AF transistors cannot be reverted back to a "0". Despite utility of the 2 T anti-fuse bitcells, existing 2 T anti-fuse bitcells often exhibit inconsistent and unpredictable gate dielectric breakdown along the gate of the program transistor and gate dielectric breakdown can occur at multiple locations, which leads to a large tail in current distribution. For example, gate dielectric breakdown may occur in the channel of the AF transistor or near a source region adjacent to the AF transistor, thereby creating a bimodal distribution and raising reading error and reliability concerns.

The split channel 1 T anti-fuse bitcells include an AF transistor with a thin (core) gate dielectric layer and an AF gate disposed thereover, and a select transistor with a thick (I/O) gate dielectric layer and a select gate disposed thereover. The AF transistor and the select transistor are disposed adjacent to each other in series. A bitline contact is connected to a source region adjacent to the select transistor. The thin gate dielectric layer of the AF transistor is thinner than the thick gate dielectric layer of the select transistor. When a normal supply voltage such as an I/O or core voltage is applied to the gates, no current is sensed along the bitline. The equivalent circuit is a capacitor. Since there is no current that flows along the bitline, the bitcell is "0" by default. When a large programming voltage is applied along the AF gate, gate dielectric breakdown occurs and a resistive path is created through the thin gate dielectric layer of the AF transistor. The equivalent circuit for the thin gate is a resistor. Due to the thickness gradient, gate oxide breakdown occurs at the weakest link, which is the junction of the thick gate dielectric layer and the thin gate dielectric layer. Despite enhanced controllability of gate dielectric breakdown with the split channel 1 T anti-fuse bitcells, programming disturbances (e.g., undesired dielectric breakdown within anti-fuse dielectric layers that are not intended to be subject to the programming voltage) still occur during programming of other AF bitcells in the integrated circuit.

Accordingly, it is desirable to provide integrated circuits that have an anti-fuse device that is more robust than existing anti-fuse configurations, with gate dielectric breakdown more predictably controlled at specific locations within the anti-fuse transistors. Further, it is desirable to provide methods of forming the integrated circuits that have the anti-fuse configuration within existing fabrication schemes without the need for added masking and patterning techniques. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming the same are provided herein. In an embodiment, an integrated circuit includes a semiconductor substrate and an anti-fuse device. The anti-fuse device includes a select transistor, a bitline contact, and a split channel transistor. The select transistor includes a select gate structure, a bitline source/drain region, and a shared source/drain region on an opposite side of the select gate structure from the bitline source/drain region. The bitline contact is disposed over and in electrical communication with the bitline source/drain region. The split channel transistor is in electrical communication with the select transistor through the shared source/drain region. The split channel transistor includes an anti-fuse gate structure and a stepped gate structure disposed between the anti-fuse gate structure and the shared source/drain region. The anti-fuse gate structure includes an anti-fuse gate and an anti-fuse dielectric layer. The stepped gate structure includes a stepped gate and a stepped dielectric layer having a greater thickness than the anti-fuse dielectric layer.

In another embodiment, a method of forming an integrated circuit includes providing a semiconductor substrate and forming an anti-fuse device in and on the semiconductor substrate. The anti-fuse device includes a select transistor, a bitline contact, and a split channel transistor. The select transistor includes a select gate structure, a bitline source/drain region, and a shared source/drain region on an opposite side of the select gate structure from the bitline source/drain region. The bitline contact is disposed over and in electrical communication with the bitline source/drain region. The split channel transistor is in electrical communication with the select transistor through the shared source/drain region. The split channel transistor includes an anti-fuse gate structure and a stepped gate structure disposed between the anti-fuse gate structure and the shared source/drain region. The anti-fuse gate structure includes an anti-fuse gate and an anti-fuse dielectric layer. The stepped gate structure includes a stepped gate and a stepped dielectric layer having a greater thickness than the anti-fuse dielectric layer.

In another embodiment, an integrated circuit includes a semiconductor substrate and an anti-fuse device. The anti-fuse device includes a shared source/drain region, a bitline contact, and a split channel transistor. The bitline contact is disposed over and in electrical communication with the shared source/drain region. The split channel transistor is in electrical communication with the bitline contact through the shared source/drain region. The split channel transistor includes an anti-fuse gate structure and a stepped gate structure disposed between the anti-fuse gate structure and the shared source/drain region. The stepped gate structure is also disposed adjacent to the anti-fuse gate structure on an opposite side thereof from the shared source/drain region. The anti-fuse gate structure includes an anti-fuse gate and an anti-fuse dielectric layer. The stepped gate structure includes a stepped gate and a stepped dielectric layer having a greater thickness than the anti-fuse dielectric layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits including the anti-fuse device and methods of forming the same as described herein. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Integrated circuits that include an anti-fuse device and methods of forming the integrated circuits are provided herein. More specifically, in an exemplary embodiment, the anti-fuse devices are more robust than existing anti-fuse configurations, with gate dielectric breakdown more predictably controlled at specific locations within the anti-fuse transistors by providing a select transistor in addition to a split channel transistor that includes an anti-fuse gate structure and a stepped gate structure. In particular, the select transistor is independent and distinct from the split channel transistor, with the stepped gate structure functioning to space the anti-fuse gate structure from a shared source/drain region to avoid soft breakdown at a corner of an anti-fuse dielectric layer in the anti-fuse gate structure. Due to the presence of the select transistor, programming disturbances are also avoided. Further, effective gate dielectric layer thicknesses for the select transistor and the split channel transistor may be obtained within existing fabrication schemes, thereby avoiding the need for added masking and patterning techniques beyond those currently employed.

Figure 1:
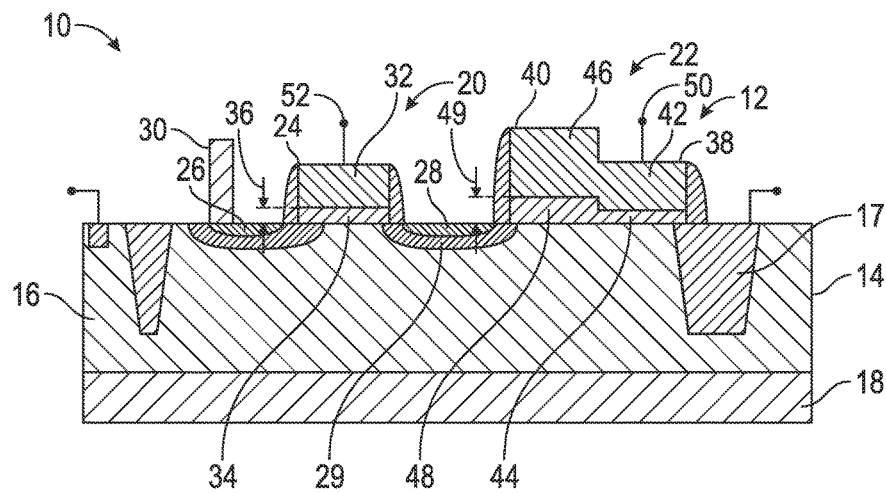
FIG. 1 is a schematic cross-sectional side view of an integrated circuit in accordance with an embodiment.

An exemplary embodiment of an integrated circuit 10 that includes an anti-fuse device 12 will now be described with reference to FIGS. 1 and 2. Referring to FIG. 1, the integrated circuit 10 includes a semiconductor substrate 14. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like.

Figure 2:
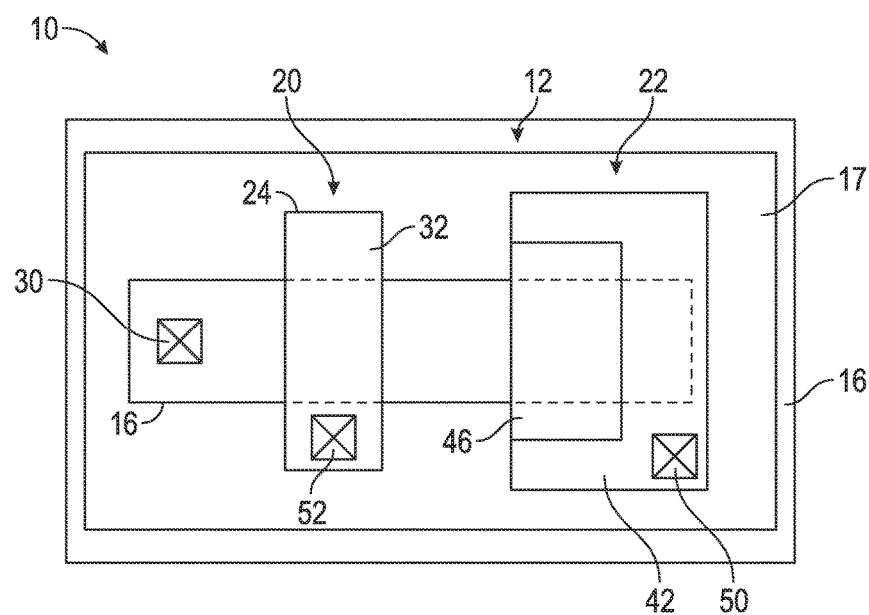
FIG. 2 is a schematic top view of the integrated circuit of FIG. 1.

In the embodiment shown in FIGS. 1 and 2, the semiconductor substrate 14 has a well region 16 with the anti-fuse device 12 formed in and over the well region 16. As referred to herein, the terms "over" or "overlying" are understood to mean that an intervening layer may lie between the overlying structure and the underlying structure, or "on" such that the overlying structure directly contacts the underlying structure. As used herein, the terms "directly over" or "directly overlying" mean that the recited features are disposed such that a vertical line passing through the upper component also passes through the lower component, with at least a portion of the upper component directly over at least a portion of the lower component. In embodiments, the well region 16 has a low-voltage dopant profile, for example a voltage potential of 0 volts. In embodiments, the well region 16 is doped with P-type conductivity-determining ions, examples of which include, but are not limited to, boron, aluminum, gallium, and indium. Additionally, in embodiments a deep well 18 may directly underlie the well region 16, with the deep well 18 having conductivity-determining ions of the opposite polarity (e.g., N-type conductivity-determining ions) from those present in the well region 16. A shallow trench isolation (STI) region 17 is formed in the semiconductor substrate 14 to electrically isolate structures formed in and on the well region 16.

Referring again to FIG. 1, the anti-fuse device 12 includes a select transistor 20 and a split channel transistor 22. As alluded to above, the anti-fuse device 12 is formed in and over the well region 16, which has the same dopant profile (i.e., the same conductivity-determining ion type and concentration) and the same voltage potential throughout. More specifically, the select transistor 20 and the split channel transistor 22 are formed directly over and in the well region 16 that has the same dopant profile.

The select transistor 20 includes a select gate structure 24, a bitline source/drain region 26, and a shared source/drain region 28 on an opposite side of the select gate structure 24 from the bitline source/drain region 26. The select transistor 20 functions to control read/write of the anti-fuse device 12 by enabling or inhibiting current flow between the split channel transistor 22 and a bitline contact 30, through the source/drain regions 26, 28, based upon voltage bias applied to the select gate structure 24. The select gate structure 24 includes a select gate 32 and a select dielectric layer 34. In embodiments, the select dielectric layer 34 includes an oxide, such as silicon oxide, and has a select dielectric thickness 36. In embodiments, the select dielectric thickness 36 is from about 25 to about 70 Å, such as from about 30 to about 55 Å. In embodiments, the select dielectric thickness 36 is the same as gate dielectric thickness in other regions of the integrated circuit 10 such that the select dielectric layer 34 can be formed at the same time as formation of other gate dielectric layers in the integrated circuit 10, thereby avoiding additional masking or processing stages beyond those present in existing fabrication stages and minimizing process costs. The source/drain regions 26, 28 are doped with conductivity-determining ions in accordance with conventional transistor formation techniques. In embodiments, the source/drain regions 26, 28 are doped with N-type conductivity-determining ions such as, but not limited to, arsenic, phosphorus, or antimony. A body contact 29 is in electrical communication with the well region 16 in accordance with conventional anti-fuse configurations.

As alluded to above, the anti-fuse device 12 includes the bitline contact 30. The bitline contact 30 is disposed directly over and in electrical communication with the bitline source/drain region 26. Referring to FIG. 2, the bitline contact 30 is in electrical communication with a bitline 31. In embodiments, the bitline source/drain region 26 is shared between the bitline contact 30 and the select transistor 20, i.e., the bitline contact 30 and the select gate 32 are both in direct electrical communication with the bitline source/drain region 26.

As alluded to above, the anti-fuse device 12 includes the split channel transistor 22. More specifically, the split channel transistor 22 includes two adjacent gate structures with gates and, optionally, associated dielectric layers that are in direct physical contact and with the associated dielectric layer having different thicknesses to result in a "stepped" cross-sectional configuration. The split channel transistor 22 is in electrical communication with the select transistor 20 through the shared source/drain region 28, i.e., the split channel transistor 22 and the select transistor 20 are in direct electrical communication with the shared source/drain region 28. The split channel transistor 22 includes an anti-fuse gate structure 38 and a stepped gate structure 40. The anti-fuse gate structure 38 includes an anti-fuse gate 42 and an anti-fuse dielectric layer 44, and the anti-fuse gate structure 38 is a programmable memory element within the anti-fuse device 12 that can be programmed by biasing the anti-fuse gate structure 38 with a programming voltage that is sufficiently high to cause gate dielectric breakdown or gate oxide rupture and formation of a resistive path in the anti-fuse dielectric layer 44 in accordance with conventional anti-fuse programming techniques. The anti-fuse gate structure 38 is laterally offset from the shared source/drain region 28, with the semiconductor substrate 14 directly beneath the anti-fuse gate structure 38 free from the halo/extension region 29 that originates from the host process and that is associated with the shared source/drain region 28. More particularly, no part of the semiconductor substrate 14 that is directly beneath the anti-fuse gate structure 38 contains the shared source/drain region 28 or any extension/halo region associated therewith. Additionally, the anti-fuse gate structure 38 is disposed directly over a portion of the STI region 17. The anti-fuse dielectric layer 44 may include the same material as the select dielectric layer 34 for sharing the same well to achieve denser cell layout and, in embodiments, the select dielectric layer 34 and the anti-fuse dielectric layer 44 have about the same thickness to maintain low cost, e.g. no added masks or extra process steps for the formation of the anti-fuse device 12. In this regard, the select dielectric layer 34 and the anti-fuse dielectric layer 44 may be concurrently formed as described in further detail below to provide process efficiency and avoid the need for added processing stages.

In embodiments, the stepped gate structure 40 is disposed between the anti-fuse gate structure 38 and the shared source/drain region 28. In embodiments and referring to FIG. 1, the stepped gate structure 40 directly overlies a halo/extension region 29 associated with the shared source/drain region 28. The stepped gate structure 40 effectively spaces the anti-fuse gate structure 38 from the shared source/drain region 28 to avoid soft breakdown at a corner of the anti-fuse dielectric layer 44 during programming, thereby enabling predictable and controlled dielectric breakdown to occur in the anti-fuse dielectric layer 44.

The stepped gate structure 40 includes a stepped gate 46 and a stepped dielectric layer 48. In embodiments, the anti-fuse gate 42 and the stepped gate 46 are in direct physical contact and the stepped dielectric layer 48 has a greater thickness 49 than the anti-fuse dielectric layer 44 to prevent dielectric breakdown in the stepped dielectric layer 48 during application of the programming bias to the anti-fuse transistor and isolate dielectric breakdown to the anti-fuse dielectric layer 44. In embodiments, the stepped dielectric layer 48 is also thicker than the select dielectric layer 34. For example, the stepped dielectric layer 48 may have a thickness of from about 50 to about 400 Å, such as from about 55 to about 75 Å. Whereas stepped gate structures have conventionally been employed as dual gates within IO devices, the stepped gate structure 40 as described herein is not provided as a select gate, and the separate select transistor 20 is provided to enable programming disturbances to be avoided (which are often associated with stepped gate structures that are employed as select gates) while confining dielectric breakdown to the anti-fuse dielectric layer 44 in a manner that was not previously possible, thereby resulting in more robust anti-fuse devices.

In embodiments and referring to FIGS. 1 and 2, the anti-fuse device 12 further includes an anti-fuse gate wordline contact 50 disposed over and in electrical communication with one of the anti-fuse gate structure 38 or the stepped gate structure 40. For example, in the embodiment shown in FIG. 2, the anti-fuse gate wordline contact 50 is disposed directly over and in electrical communication with the anti-fuse gate structure 38. Also in the embodiment shown, a select gate wordline contact 52 is disposed over and in electrical communication with the select gate 32. In this regard, the select gate wordline contact 52 is configured to provide appropriate voltage bias to the select gate 32 during read/write of the anti-fuse device 12 while the anti-fuse gate wordline contact 50 is only configured to bias the anti-fuse gate 42.

An exemplary method of forming an integrated circuit 10 includes providing the semiconductor substrate 14 and forming the anti-fuse device 12, as described above, in and on the semiconductor substrate 14. Convention layer deposition and patterning techniques employed in transistor and floating gate fabrication may be employed to form the anti-fuse device 12. In embodiments, a field effect transistor (not shown) is formed in a different region of the semiconductor substrate 14 from the anti-fuse device 12, with the field effect transistor including a gate dielectric layer and a gate electrode. The stepped dielectric layer 48 may be formed having the same thickness as the gate dielectric layer in the field effect transistor that is formed in the different region of the semiconductor substrate 14. In this embodiment, the gate dielectric layer in the field effect transistor that is formed in the different region of the semiconductor substrate 14 and the stepped dielectric layer 48 may be concurrently formed, thereby enabling fabrication of the stepped dielectric layer 48 to be effectively deposited and patterned during existing fabrication stages without the need to add further deposition/patterning stages. In embodiments, the stepped dielectric layer 48 is formed in accordance with 3.3 or 5V oxide fabrication stages for IO device as dual gate process, which are conventional in various existing fabrication facilities.

Figure 3:
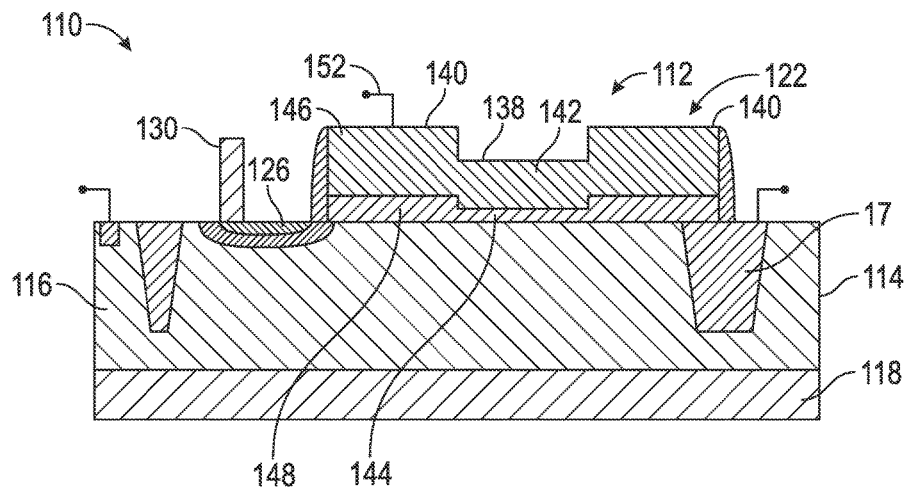
FIG. 3 is a schematic cross-sectional side view of an integrated circuit in accordance with another embodiment.
Figure 4:
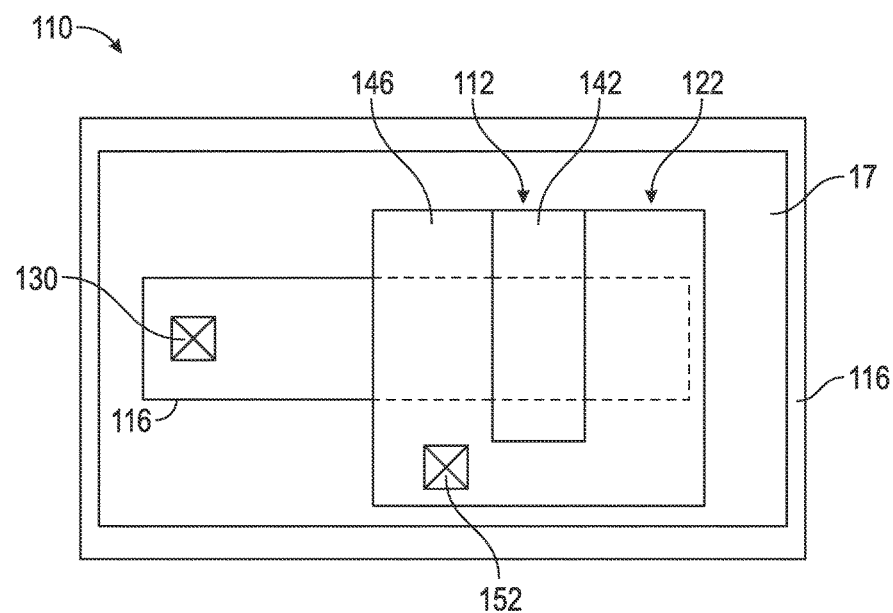
FIG. 4 is a schematic top view of the integrated circuit of FIG. 3.

Another embodiment of an integrated circuit 110 will now be described with reference to FIGS. 3 and 4. Referring to FIG. 3, the integrated circuit 110 includes a semiconductor substrate 114 and an anti-fuse device 112. The semiconductor substrate 114, which may be the same as described above, has a well region 116 with the anti-fuse device 112 formed in and over the well region 116. In this embodiment, the well region 116 may have a medium-voltage dopant profile, with a voltage potential of from about 50 to about 160 volts. In embodiments, the well region 116 is doped with P-type conductivity-determining ions. Additionally, in embodiments a deep well 118 may directly underlie the well region 116, with the deep well 118 having conductivity-determining ions of the opposite polarity (e.g., N-type conductivity-determining ions) from those present in the well region 116 to suppress current leakage to/from other portions of the integrated circuit 10.

Referring to FIG. 3, the anti-fuse device 112 of this embodiment includes a shared source/drain region 126, a bitline contact 130 disposed over and in electrical communication with the shared source/drain region 126, and a split channel transistor 122 in electrical communication with the bitline contact 130 through the shared source/drain region 126. Referring to FIG. 4, the bitline contact 130 is in electrical communication with a bitline 131. In this embodiment, the shared source/drain region 126 is shared between the bitline contact 130 and the split channel transistor 122, and a separate select transistor is absent from between the split channel transistor 122 and the bitline contact 130. In embodiments, the bitline contact 130 and the split channel transistor 122 are in direct electrical communication with the shared source/drain region 126, i.e., no other transistors are present in series between the split channel transistor 122 and the shared source/drain region 126 or between the bitline contact 130 and the shared source/drain region 126. In embodiments, the bitline contact 130 directly overlies the shared source/drain region 126.

Referring to FIG. 3, the split channel transistor 122 includes an anti-fuse gate structure 138 that includes an anti-fuse gate 142 and an anti-fuse dielectric layer 144. The anti-fuse gate 142 and the anti-fuse dielectric layer 144 are the same as described above. The anti-fuse gate structure 138 is a programmable memory element within the anti-fuse device 112 that can be programmed by biasing the anti-fuse gate structure 138 with a programming voltage that is sufficiently high to cause gate dielectric breakdown and formation of a resistive path in the anti-fuse dielectric layer 44 in accordance with conventional anti-fuse programming techniques. The split channel transistor 122 further includes a stepped gate structure 140 that is disposed between the anti-fuse gate structure 138 and the shared source/drain region 126, similar to the configuration as described above and as shown in FIG. 1. The stepped gate structure 140 includes a stepped gate 146 and a stepped dielectric layer 148, with the stepped dielectric layer 148 having a greater thickness than the anti-fuse dielectric layer 144. In this embodiment, the stepped gate structure 140 functions as the select transistor and a select gate wordline contact 152 is disposed over and in electrical communication with the stepped gate 146. Also in this embodiment, the stepped gate structure 140 is disposed adjacent to the anti-fuse gate structure 138 on an opposite side thereof from the shared source/drain region 126, and may wrap around the anti-fuse gate structure 138 as shown in FIG. 4, to enable a higher device density within the integrated circuit 110 while still effectively insulating the anti-fuse gate structure 138 from programming disturbances attributable to programming of adjacent anti-fuse devices (not shown).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit comprising:
a semiconductor substrate; and
an anti-fuse device comprising:
a select transistor comprising a select gate structure, a bitline source/drain region, and a shared source/drain region on an opposite side of the select gate structure from the bitline source/drain region;
a bitline contact disposed over and in electrical communication with the bitline source/drain region; and
a split channel transistor in electrical communication with the select transistor through the shared source/drain region, wherein the split channel transistor comprises:
an anti-fuse gate structure comprising an anti-fuse gate and an anti-fuse dielectric layer; and
a stepped gate structure disposed between the anti-fuse gate structure and the shared source/drain region, wherein the stepped gate structure comprises a stepped gate and a stepped dielectric layer having a greater thickness than the anti-fuse dielectric layer;
wherein the select transistor and the split channel transistor are formed over and in a region of the semiconductor substrate having a same, low-voltage dopant profile.

2. The integrated circuit of claim 1, wherein the source/drain regions are doped with n-type conductivity-determining ions and wherein the region of the semiconductor substrate over which the select transistor and the split channel transistor are formed is doped with p-type conductivity-determining ions.

3. The integrated circuit of claim 1, wherein the anti-fuse gate and the stepped gate are in direct physical contact.

4. The integrated circuit of claim 3, wherein the anti-fuse device further comprises an anti-fuse gate wordline contact that is disposed over and in electrical communication with one of the anti-fuse gate structure or the stepped gate structure.

5. The integrated circuit of claim 4, wherein the anti-fuse gate wordline contact is disposed directly over and in electrical communication with the anti-fuse gate structure.

6. The integrated circuit of claim 1, wherein the select gate structure comprises a select gate and a select dielectric layer.

7. The integrated circuit of claim 6, wherein the anti-fuse device further comprises a select gate wordline contact disposed over and in electrical communication with the select gate.

8. The integrated circuit of claim 7, wherein the stepped dielectric layer is thicker than the select dielectric layer.

9. The integrated circuit of claim 1, wherein the stepped gate structure directly overlies a halo/extension region associated with the shared source/drain region.

10. The integrated circuit of claim 9, wherein the anti-fuse gate structure is laterally offset from the shared source/drain region and wherein the semiconductor substrate beneath the anti-fuse gate structure is free from the halo/extension region associated with the shared source/drain region.

11. An integrated circuit comprising:
a semiconductor substrate; and
an anti-fuse device comprising:
  a select transistor comprising a select gate structure comprising a select gate and a select dielectric layer; a bitline source/drain region; and a shared source/drain region on an opposite side of the select gate structure from the bitline source/drain region;
  a bitline contact disposed over and in electrical communication with the bitline source/drain region; and
  a split channel transistor in electrical communication with the select transistor through the shared source/drain region, wherein the split channel transistor comprises:
    an anti-fuse gate structure comprising an anti-fuse gate and an anti-fuse dielectric layer;
    a stepped gate structure disposed between the anti-fuse gate structure and the shared source/drain region, wherein the stepped gate structure comprises a stepped gate and a stepped dielectric layer having a greater thickness than the anti-fuse dielectric layer; and
    a select gate wordline contact disposed over and in electrical communication with the select gate;
  wherein the select dielectric layer and the anti-fuse dielectric layer have about the same thickness.

* * * * *